11/4/80 XR 4,232,376

United States Patent [19]

Dion et al.

[11] 4,232,376

[45] Nov. 4, 1980

[54] RASTER DISPLAY REFRESH SYSTEM

[75] Inventors: Donald F. Dion; David R. Wojcik, both of Burlington, Mass.

[73] Assignee: RCA Corporation, New York, N.Y.

[21] Appl. No.: 20,937

[22] Filed: Mar. 15, 1979

[51] Int. Cl.[2] .............................................. G11C 13/00

[52] U.S. Cl. .................................... 365/222; 358/140; 340/750; 340/798

[58] Field of Search ................ 358/140; 340/750, 798, 340/799; 315/364; 365/222

[56] References Cited

U.S. PATENT DOCUMENTS 3,396,377 8/1968 Strout .................................. 340/750

*Primary Examiner*—Terrell W. Fears

*Attorney, Agent, or Firm*—Samuel Cohen; Carl V. Olson

[57] ABSTRACT

A raster display refresh system includes a charge coupled device (CCD) circulating refresh memory for maintaining a display of information on a cathode ray tube (CRT) screen. The X and Y address of picture elements to be changed are stored in raster scan sequence in a small random access memory (RAM). Whenever a picture element address in the data register of the RAM equals the X and Y screen address of the scanning beam of the CRT, a corresponding new picture element signal stored in the RAM is substituted for the old picture element signal previously circulating the CCD refresh memory.

6 Claims, 3 Drawing Figures

RASTER DISPLAY REFRESH SYSTEM

Figure 1:
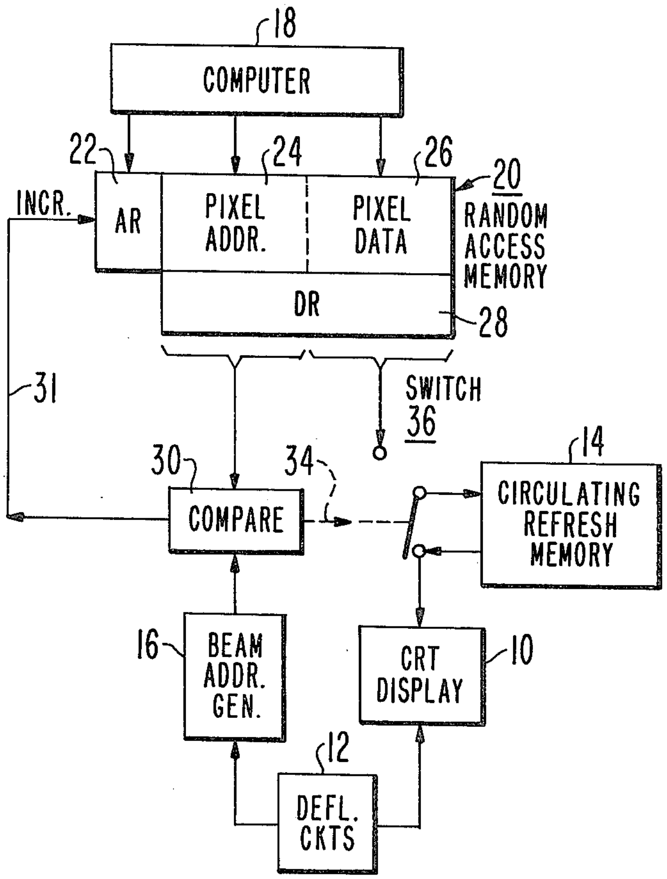

This invention relates to image display systems, and particularly to systems for refreshing and changing the image on a cathode ray tube display device. The invention is particularly useful for refreshing and changing simple graphic images, rather than half-tone TV-type images.

In a display device, such as a cathode ray tube, it is necessary to continually refresh the image every time a frame is raster scanned. The refresh signal is supplied from a memory in which signals representing the image are stored. The refresh memory is commonly a random access memory (RAM) which is accessed in synchronism with the deflection of the beam in the cathode ray tube (CRT). A very large and expensive random access refresh memory is needed to store signals representing an image occupying much or all of a displayed image frame. The large, expensive random access memory can be replaced by a large, but much less expensive, charge coupled device (CCD) serial recirculating refresh memory. Then there arises the problem of changing portions or all of the displayed information by changing some or all of the data stored in the CCD recirculating memory.

According to an example of the invention, a very effective and economical display system is provided by the use of a charge coupled device (CCD) serial recirculating refresh memory in combination with a small random access (RAM) memory in which changed display data is collected prior to being substituted into the CCD recirculating refresh memory. New data is directed into the recirculating memory at proper instants of time by means including a comparator for determining when each picture element data in the circulating memory which it is desired to update passes the write-in port of the recirculating memory.

In the drawing:

FIG. 1 is a simplified block diagram of a raster sacn display system; and

Figure 2A:
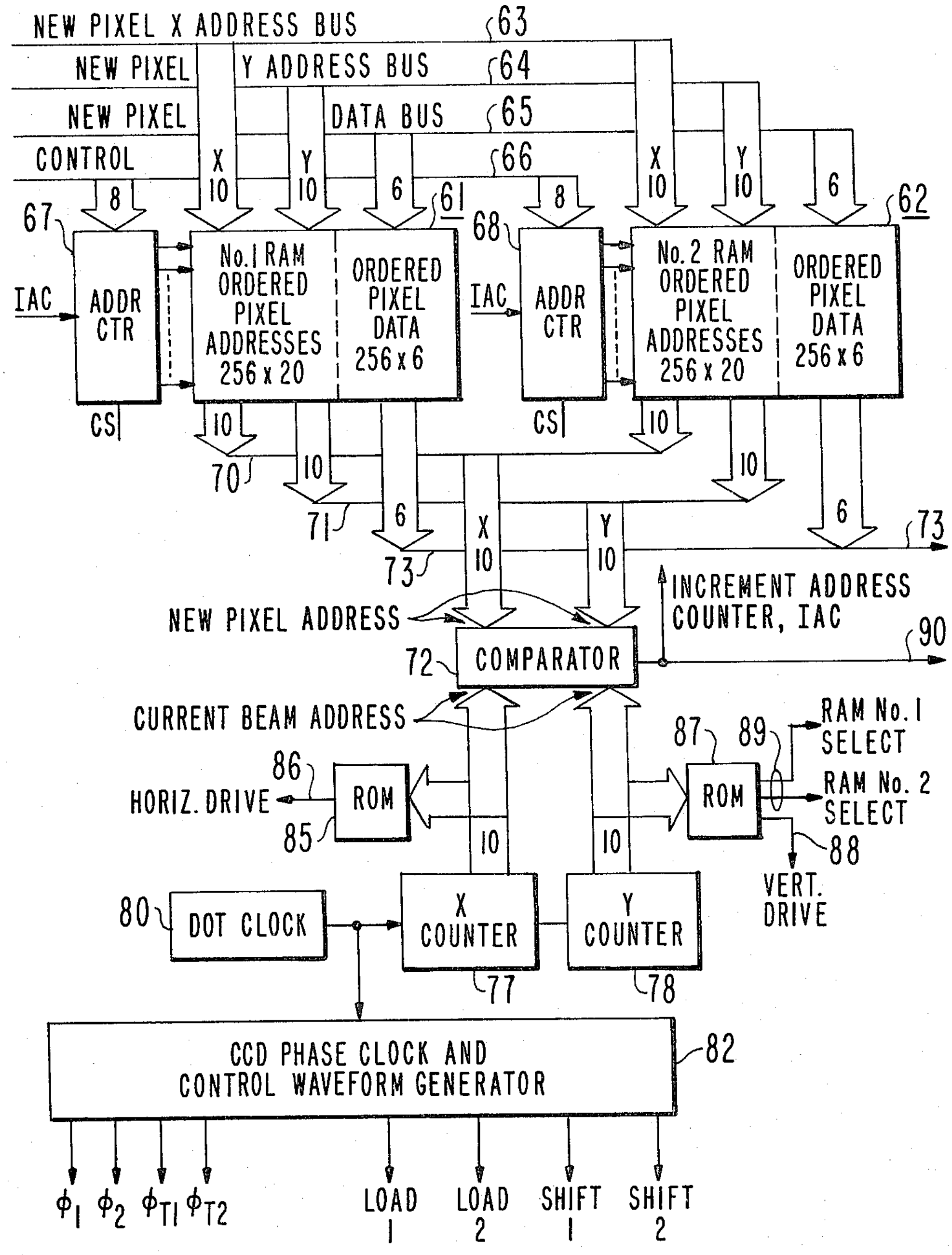
Figure 2B:
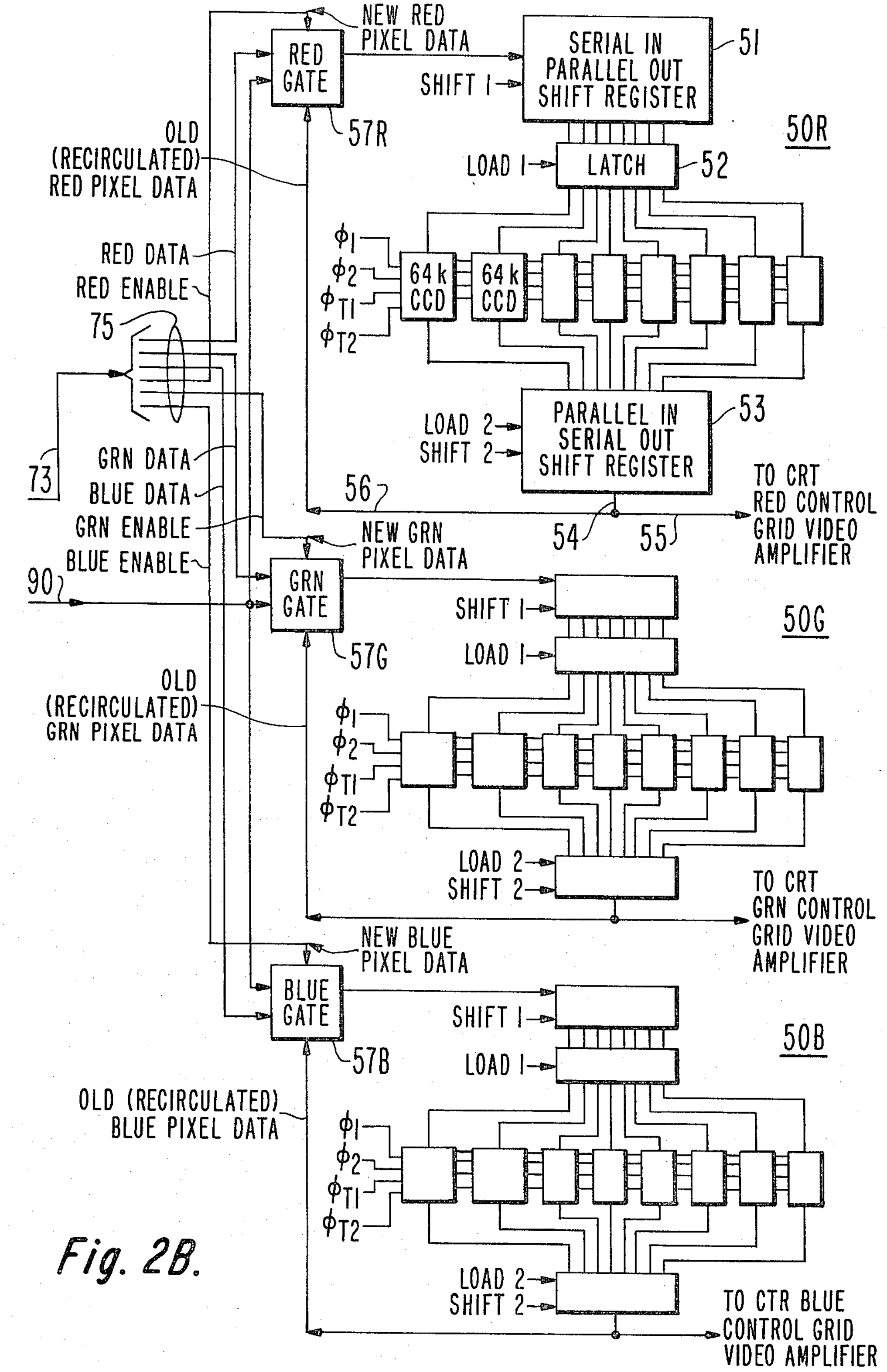

FIGS. 2A and 2B together show a more detailed block diagram of a raster scan display system.

Referring now in greater detail to FIG. 1, a cathode ray tube display 10 has an electron beam which is raster scanned in the usual TV fashion under control of deflection circuits 12. The electron beam is modulated in intensity under control of signals stored in, and continuously recirculated around a loop in, a circulating refresh memory 14. The circulating memory 14 is preferably a charge coupled device (CCD) circulating memory because such memories in large sizes capable of storing data for a full frame display are relatively inexpensive. The information or image displayed on the screen of display unit 10 is maintained unchanged over any desired period of time by the refreshing action of the circulating memory 14. A beam address generator 16 operates under control of the deflection circuits 12 to generate digital addresses continuously representing the horizontal and vertical coordinates of the scanned electron beam in the display unit 10.

The image displayed by the display unit 10 originates in a computer 18 which supplies information to a digital random access memory (RAM) 20. The RAM 20 includes an address register or address counter 22 for the addresses of word storage locations in the memory. Each word storage location includes a pixel (picture element) address 24 which may be 20 bits, and corresponding pixel data (brightness) 26, which in the present example is 1 bit. If the one-bit pixel data is a "1" it represents a bright spot on the display, and if it is a "0" it represnts a dark spot. The computer fills the RAM 20 by first resetting the address counter 22, and then by supplying a pixel address and corresponding pixel data to the first addressed word location. The address counter 22 is incremented and the second word location is filled. The process may be continued until the RAM is filled. The successive pixel word locations contain pixel addresses and data in the order in which the pixels are reached during a raster scan of one complete frame displayed on the face of the cathode ray tube.

One word location at a time is read out in numerical order from the RAM 20 to a memory data register 28 by sequentially advancing the address in the address counter 22. The incrementing of the address counter 22 is accomplished by a signal over line 31 from a comparator means 30. The comparator means 30 continously receives beam address digital signals from generator 16 corresponding with the advancing raster scan position of the deflected electron beam in the CRT display unit 10. The comparator means 30 also receives from data register 28 the pixel address portion of the word location accessed by the address in address counter 22. When the pixel address from the data register 28 of RAM 20 equals the CRT beam address from generator 16, the comparator 30 supplies a signal over line 34 to means represented schematically as a switch 36 to cause a coupling of the pixel data corresponding with that pixel address from the data register 28 of the RAM 20 to the circulating refresh memory 14. The brightness signal of a new pixel is thus substituted into the refresh memory in place of the pixel brightness signal that was circulating in the memory. The comparator then sends an incrementing signal over line 31 to the address register 22 of RAM 20, and switch 36 returns to the position shown in the drawing to complete the data circulating loop. Whenever the pixel address matches the beam address, the comparator momentarily operates switch 36 to cause pixel data from the RAM to be substituted for circulating data in refresh memory 14. It will be understood by those skilled in the CCD memory art, that when switch 36 breaks the recirculation path back to memory 14, a pixel charge is diverted to an erasing means, and a new charge determined by the "1" or "0" data bit from memory 20 is substituted into the place in the circulating memory 14 vacated by the diverted pixel charge. The RAM 20 will normally have a very much smaller data storage capacity than the CCD circulating refresh memory 14, and may have a storage capacity only 1 percent of the refresh memory.

In the operation of the system of FIG. 1, the computer 18 computes the changes to be made in the display appearing at 10, and loads the RAM 20 at a computer-operating rate determined by computer cycle time and the complexity of the image-change computations. The sequential word storage locations in the RAM are loaded with pixel words affecting locations on the display screen in the order in which the screen locations are reached by the scanning electron beam in going from left to right along successive lines in sequence from the top of the screen to the bottom. The RAM may, for example, contain information intended for successive pixel locations along a single line, or, for pixel locations in successive lines, or, pixel locations scattered through the raster scanned display screen in the order in which they are reached by the cathode ray beam.

The digital pixel data stored in the RAM is substituted into the circulating refresh memory at the correct locations in the circulating analog data stream by the action of the comparator 30, which operates the switch 34 whenever the beam position signal from the generator 16 equals the pixel address 24 from the RAM.

The system of FIG. 1 is very advantageous in including a large-capacity, inexpensive CCD circulating memory 14 a small, inexpensive RAM 20.

Reference is now made to FIGS. 2A and 2B for a description in greater detail of a color display refresh system. Three CCD circulating refresh memories 50R, 50G and 50B (FIG. 2*b*) are provided for the red, green and blue signals applied to a standard color kinescope (not shown). Circulating memory 50R consists of eight CCD serial memories operated in parallel between a serial-to-parallel converter 51 and a latch 52 at the inputs, and a parallel-to-serial converter 53 at the outputs. Each of the eight 64K CCD memory units may be a Type F4642DC unit made by Fairchild Semiconductor, Inc. The parallel arrangement of serial memories is employed if the speed of propagation or shifting of information through the CCD serial memory used is not fast enough to accommodate display information at TV scan rates. With eight CCD serial memories in parallell, the shifting rate in each memory is one-eighth that required for one serial memory. The shifting of information is accomplished by the usual signals $\phi_1$, $\phi_2$, $\phi_{T1}$ and $\phi_{T2}$ from unit 18 in FIG. 2A. The output at 54 of the circulating memory 50R is applied over line 55 to the red video signal amplifier of a color kinescope, and over line 56 and through a red signal gate 57 back to the input of the serial memory for recirculation therethrough. The memories 50G and 50B for the green and blue signals are the same as the memory 50R.

The system of FIG. 2A includes two identical 256-word random access memories (RAM's) 61 and 62 which are operated in a manner such that one can be written into from a computer while the other is being read from to the circulating memories 50R, 50G and 50B, and vice versa, in alternating fashion. A computer (not shown) supplies pixel X addresses and Y addresses on ten-conductor buses 63 and 64, and supplies corresponding pixel data on a six-conductor bus 65. The computer also supplies an address counter control signal on an eight-conductor bus 66 to address counters 67 and 68. When the computer is supplying information to one of the RAM's, the other RAM is available to supply the pixel addresses stored therein over buses 70 and 71 to a comparator 72, and to supply the corresponding pixel data over bus 73 to FIG. 2B, where the bus is shown to have individual conductors 75 for enabling each of the gates 57R, 57G and 57B, and for red, green and blue pixel data connected to pass through respective enabled gates to respective circulating memories 50R, 50G and 50B.

The comparator 72 receives signals from X and Y counters 77 and 78 for comparison with the X and Y pixel addresses from one of the RAM's 61 and 62. The counters continuously provide signals representing the present position of the electron beam on the screen of the color kinescope. The counters are driven from a system dot clock 80, which also drives a unit 82 which generates signals $\phi_1$, $\phi_2$, $\phi_{t1}$, $\phi_{t2}$ to control the shifting of information through circulating memories 50R, 50G and 50B, and also generates LOAD 1, LOAD 2, SHIFT 1 and SHIFT 2 signals to control the operation of the serial-to-parallel registers 51, the latches 52 and the parallel-to-serial registers 53 in the circulating memories.

The counts from X counter 77 are coupled as addresses to a read-only memory (ROM) 85, from which a horizontal synchronizing pulse is provided on line 86 to control the horizontal deflection of the color kinescope display. The counts from Y counter 78 are coupled as addresses to a read-only memory 87, from which a horizontal synchronizing pulse is provided on line 88 to control the vertical deflection of the color kinescope display, and on lines 89 to control the alternating writing into and reading out of the RAM's 61 and 62. Since the deflection system of the color kinescope is controlled by the counters 77 and 78, the outputs of the counters applied to comparator 72 always accurately represent the present deflected position of the electron beam on the face of the kinescope.

The comparator 72 has an output line 90 for enabling all of gates 57R, 57G and 57B when the X and Y addresses from the X and Y counters 77 and 78 equal the X and Y pixel addresses received from a RAM 61 or 62. Operation of the gates causes pixel data from the RAM to be substituted for pixel data already circulating in memories 57R, 57G and 57B. The output 90 of the comparator 72 is also connected to increment address counters 67 and 68 after every address match by the comparator.

What is claimed is:

1. A raster display refresh system, comprising a cathode ray tube display unit having beam deflection means, a beam address generator synchronized with said beam deflection means, a circulating refresh memory operative in synchronism with said beam deflection means to repeatedly supply a frame of picture element data signals to said cathode ray tube, a small random access memory having storage locations each for storing, in order of raster scan sequence, a picture element address and associated picture element data, an address counter to sequentially access said storage locations, and a comparator means operative when the picture element address from an accessed storage location matches the beam address from the beam address generator to transfer the accessed picture element data from the random access memory to the circulating refresh memory and to increment said address counter.

2. A system as defined in claim 1, wherein said circulating refresh memory is a charge coupled device memory.

3. A system as defined in claim 1 wherein said picture element data is brightness information.

4. A system as defined in claim 1 wherein said picture element data is color information.

5. A system as defined in claim 1 wherein said cathode ray tube display unit is a color cathode ray tube display unit, and said circulating refresh memory has three circulating signal paths connected with red, green and blue signal inputs of said color cathode ray tube display unit.

6. A system as defined in claim 1 wherein said random access memory is in two parts one of which can be read into when the other is read out of.

* * * * *